US012431692B2

(12) United States Patent
Muendel et al.

(10) Patent No.: US 12,431,692 B2
(45) Date of Patent: Sep. 30, 2025

(54) MULTI-WAVELENGTH LASER DIODE

(71) Applicant: Lumentum Operations LLC, San Jose, CA (US)

(72) Inventors: Martin H. Muendel, Oakland, CA (US); Victor Rossin, Mountain View, CA (US); James J. Morehead, Oakland, CA (US); John G. Bai, Cupertino, CA (US)

(73) Assignee: Lumentum Operations LLC, San Jose, CA (US)

( * ) Notice: Subject to any disclaimer, the term of this patent is extended or adjusted under 35 U.S.C. 154(b) by 1119 days.

(21) Appl. No.: 17/305,484

(22) Filed: Jul. 8, 2021

(65) Prior Publication Data

US 2022/0344910 A1 Oct. 27, 2022

Related U.S. Application Data

(60) Provisional application No. 63/201,359, filed on Apr. 26, 2021.

(51) Int. Cl.
*H01S 5/50* (2006.01)
*H01S 3/23* (2006.01)
*H01S 5/12* (2021.01)
*H01S 5/40* (2006.01)

(52) U.S. Cl.
CPC .............. *H01S 5/5027* (2013.01); *H01S 5/12* (2013.01); *H01S 5/4025* (2013.01); *H01S 3/2308* (2013.01)

(58) Field of Classification Search
CPC .... H01S 5/4012; H01S 5/4062; H01S 5/4087; H01S 3/2308
See application file for complete search history.

(56) References Cited

U.S. PATENT DOCUMENTS

| 6,130,903 A | 10/2000 | Moloney et al. |
| 7,199,924 B1 * | 4/2007 | Brown ............... H01S 3/2383 398/87 |
| 8,427,749 B2 | 4/2013 | Du et al. |
| 8,472,763 B1 * | 6/2013 | Liu ................ G02B 6/3853 385/47 |
| 2004/0057653 A1 * | 3/2004 | Fukuda ................ G02B 6/42 385/37 |

(Continued)

FOREIGN PATENT DOCUMENTS

EP 1083642 A2 * 3/2001 ......... G02B 6/12011

OTHER PUBLICATIONS

Kwon et al. "Monolithically Integrated Multiwavelength Grating Cavity Laser", IEEE Photonics Technology Letters, vol. 17, No. 9, Sep. 2005, pp. 2788-2790. (Year: 2005).*

(Continued)

*Primary Examiner* — Eric L Bolda
(74) *Attorney, Agent, or Firm* — Harrity & Harrity, LLP

(57) ABSTRACT

In some implementations, an optical device (e.g., a monolithic master oscillator power amplifier (MOPA) diode) may include a first facet, one or more gratings, an amplifier structure terminated with a second facet, and an oscillator array that includes multiple singlemode oscillators coupled to the first facet and to the one or more gratings. In some implementations, the multiple singlemode oscillators may be configured to generate multiple seed beams and to transmit the multiple seed beams into the amplifier structure through the one or more gratings.

20 Claims, 14 Drawing Sheets

(56) References Cited

U.S. PATENT DOCUMENTS

| | | | |
|---|---|---|---|
| 2015/0092800 A1* | 4/2015 | Zucker | H01S 5/02453 |
| | | | 372/29.015 |
| 2017/0141532 A1* | 5/2017 | Kurobe | H01S 5/4025 |
| 2021/0088657 A1* | 3/2021 | Shah | G01S 17/42 |

OTHER PUBLICATIONS

Paschotta, "Master Oscillator Power Amplifier," RP Photonics Encyclopedia, 4 pages [retrieved from https://www.rp-photonics.com/master_oscillator_power_amplifier.html on Jun. 17, 2021].

* cited by examiner

Modified WBC configuration using lateral color chirped MOPA

MULTI-WAVELENGTH LASER DIODE

CROSS-REFERENCE TO RELATED APPLICATION

This Patent Applications claims priority to U.S. Provisional Patent Application No. 63/201,359, filed on Apr. 26, 2021, and entitled "MULTI-WAVELENGTH LASER DIODE." The disclosure of the prior Application is considered part of and is incorporated by reference into this Patent Application.

TECHNICAL FIELD

The present disclosure relates generally to a multi-wavelength laser diode and to a monolithic master oscillator power amplifier (MOPA) diode chip that includes multiple grating-locked singlemode oscillators coupled into one amplifier region such that the grating-locked singlemode oscillators generate overlapping seed beams that efficiently and uniformly extract gain from the amplifier while reducing or eliminating filamentation on an emission facet.

BACKGROUND

The term master oscillator power amplifier (MOPA) refers to a laser configuration that includes a master oscillator (e.g., a single-frequency laser) configured to produce a highly coherent beam and an optical amplifier configured to increase the output power while preserving the main properties of the master oscillator. A special case is a master oscillator fiber amplifier (MOFA), where the power amplifier is a fiber device. In other cases, a MOPA may include a solid-state bulk laser and a bulk amplifier, or a tunable external-cavity diode laser and a semiconductor optical amplifier. Although a MOPA configuration is generally more complex than a laser that directly produces the required output power, a MOPA design may reach the required performance (e.g., in terms of linewidth, wavelength tuning range, beam quality, and/or pulse duration) more easily because various performance aspects are decoupled from the generation of high powers. In addition, combining existing laser technology and an existing amplifier (or amplifier chain) may be simpler and/or more cost-effective than developing a new laser with a higher output power. However, MOPA designs also pose various challenges, such as higher laser noise and/or sensitivity to back reflections.

SUMMARY

In some implementations, a monolithic optical device includes: a first facet; one or more front gratings; an amplifier structure terminated with a second facet; and an oscillator array coupled to the first facet and to the one or more front gratings, wherein the oscillator array includes multiple singlemode oscillators configured to generate multiple seed beams, and wherein the multiple singlemode oscillators are coupled into the amplifier structure such that the multiple singlemode oscillators transmit the multiple seed beams through the one or more front gratings and into the amplifier structure.

In some implementations, an optical assembly includes: an optical device that includes multiple grating-locked singlemode oscillators configured to transmit multiple seed beams having different wavelengths into a shared amplifier structure, wherein the multiple seed beams expand within the shared amplifier structure to form chirped light that is emitted by the optical device; a dispersive element in an optical path between the laser diode and an optical fiber; and one or more collimator lenses coupling the chirped light to the dispersive element, wherein the multiple seed beams that have the different wavelengths impinge upon the dispersive element at different incidence angles, and wherein the dispersive element is arranged to transmit the multiple seed beams at respective angles that cause the multiple seed beams to overlap in an output beam that enters the optical fiber.

In some implementations, a package structure includes: at least one row of multiple optical devices staggered in height, wherein the multiple optical devices each include: an amplifier structure terminated with an emission facet; an oscillator array that includes multiple oscillators; and a grating array including one or more gratings coupling the multiple oscillators into the amplifier structure such that the multiple oscillators transmit multiple seed beams through the one or more gratings and into the amplifier structure; and a wavelength beam combiner arranged to receive multiple beams emitted by the multiple laser diodes and to align the multiple beams within an output beam.

DETAILED DESCRIPTION

Figure 1:
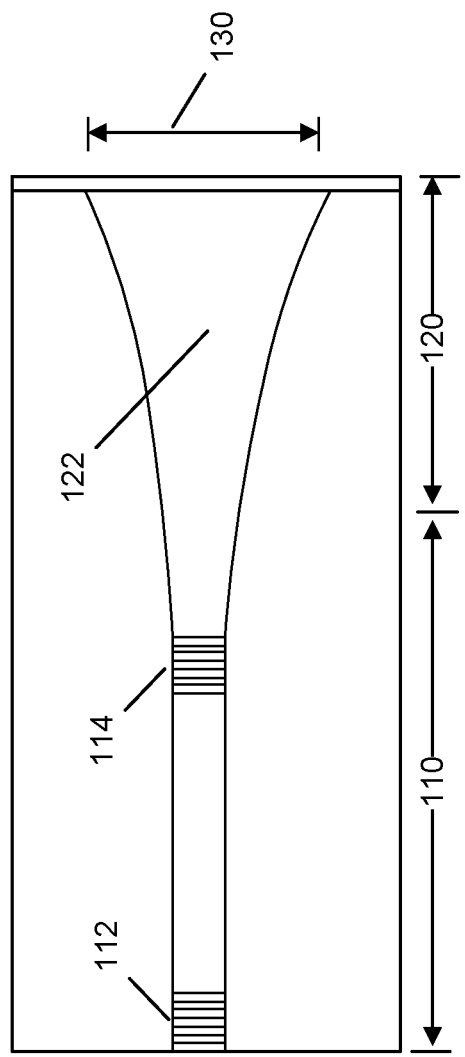
FIG. 1 is a diagram illustrating an example of a flared master oscillator power amplifier (MOPA) diode.

The following detailed description of example implementations refers to the accompanying drawings. The same reference numbers in different drawings may identify the same or similar elements.

A low cost, highly efficient, high-brightness, 976 nanometer (nm)-locked multimode pump may be useful for pumping kilowatt (kW) fiber lasers. For example, pumping a fiber doped with Ytterbium (Yb) on a narrow absorption band at 976 nm may be useful due to an approximately four times higher absorption and superior photon efficiency compared to pumping a broad absorption at 920-960 nm. However, pumping an Yb-doped fiber on the narrow absorption band at 976 nm is seldom implemented in practice because conventional non-locked multimode pumps have an emission spectrum that is too broad for the 976 nm absorption band.

In addition to not being well-matched to Yb pumping at 976 nm, conventional non-locked pumps are limited by unfavorable brightness scaling when a chip is scaled to higher power. The poor scaling stems from various factors, including that a beam tends to break into multiple sharp spatial peaks distributed across an emission facet (e.g., in a phenomenon known as filamentation). In addition, because the maximum chip operating power is typically limited by the peak intensity on the facet (e.g., a catastrophic optical damage threshold), the chip operating power is limited by the intensity of the peaks rather than by the overall average power across the aperture. Furthermore, if the chip operating power were to be scaled up by increasing the emitter width (e.g., in a range of 100-200 micrometers (μm)), then the chip brightness would be degraded at an unfavorable rate. For example, the increased emitter area increases the near-field size, and the far-field size also increases due to the increased width increasing the thermal lens strength of the emitter. These and/or other factors may degrade the chip brightness significantly even as the power is scaled up.

Existing wavelength-locked multimode pumps, while generally effective for narrow-wavelength laser pumping, are relatively costly for the large kW fiber laser market. These pumps may use an external volume Bragg grating (VBG) for wavelength locking, as well as a polarization beam combiner (PBC) for brightness enhancement, both of which add significant component costs as well as optical losses on the order of ~5-10% apiece, thereby significantly increasing the cost per watt. Additionally, the optical power coupled by the VBG back into the diode chip for locking increases the facet loading and requires the chip to be operated at a lower power level than in a non-locked pump. Thus, for example, whereas a conventional non-locked pump may be rated at about 200 watts (W), a comparable locked pump may be both more expensive per unit and may be rated at only about 150 W, thus with a much higher cost per watt of pump power. Even accounting for the benefits of the locked wavelength, such pumps cannot be cost-effective for kW applications, and have therefore not gained wide acceptance or usage.

Another existing wavelength-locking technology uses a grating written on a multimode diode. However, conventional grating designs pose various challenges, including a need for a modified epitaxial design that is less efficient and less reliable than the epitaxial design used in non-locked chips. Additional design challenges include a high sensitivity of grating reflectivity to the grating shape, a narrow process window, and a limitation of producing only uniform grating pitches, which precludes non-uniform grating designs that offer performance benefits. As a result, existing technologies that use a grating written on a multimode diode are also not cost-effective for kW applications. Additionally, both styles of wavelength-locked pumps suffer from the same power-scaling limitations as conventional non-locked pumps.

FIG. 1 illustrates an example 100 of a flared master oscillator power amplifier (MOPA) diode (or semiconductor laser), which can be used as another wavelength-locked diode design. As shown in FIG. 1, the flared MOPA diode includes a master oscillator 110, one or more on-chip gratings 112, 114, and a flared amplifier 120. As shown in FIG. 1, the master oscillator 110 may be a singlemode oscillator defined by two gratings 112, 114, or in some cases the grating 112 may be replaced by a high-reflectivity coating. The master oscillator 110 may generate a beam that is coupled through the central grating 114 and into a pumped gain region 122 of the flared amplifier 120, where the beam is allowed to expand to a size greater than would be sustainable within a pure singlemode oscillator. For example, the pumped gain region 122 has a flared geometry (e.g., a "trumpet-flare"), whereby the pumped gain region 122 has a first width at an input end (e.g., near the central grating 114) that substantially matches the width of the output of the master oscillator 110 and a second width at an output end that is significantly wider than the first width. Typically, the increase in width in the pumped gain region 122 of the flared amplifier 120 matches or is only slightly larger than the divergence of the beam transmitted by the master oscillator 110. The output from the flared amplifier 120 may pass through an output facet 130, which may have an anti-reflective (AR) coating. In general, the flared MOPA diode shown in FIG. 1 may produce an output that is nominally near singlemode, and therefore of a much better beam quality than the multimode locked diodes described above. However, the beam is typically somewhat distorted by the thermal lens of the amplifier as well as by non-uniform amplification and by astigmatism. Additional challenges include that the amplifier area, and thus the output power, are lower than in multimode diodes and that efficiency is low because the amplifier gain is not uniformly saturated for optimal extraction. Accordingly, there is a need for a low-cost, highly efficient, high-brightness, wavelength-locked multimode pump.

Some implementations described herein relate to a monolithic diode chip design that includes multiple grating-locked, singlemode oscillators coupled into one amplifier region. In some implementations, the monolithic diode chip includes an oscillator array that has at least two singlemode seed oscillators. For example, in some implementations, the oscillator array may include between five and thirty singlemode seed oscillators, may include one hundred or more singlemode seed oscillators, or may include another suitable number of singlemode seed oscillators. In some implementations, the singlemode seed oscillators may include a high-reflectivity (HR) coating or grating at or near a first (e.g., rear) chip facet, and one or more gratings at or near the other end of the oscillator array. Additionally, or alternatively, the monolithic diode chip may include a single grating extending over most or all of the oscillator array, as in a distributed-feedback laser. In either case, the oscillators in the oscillator array are all configured to transmit a seed beam into a shared broad-area amplifier structure that is terminated with a second (e.g., front) chip facet coated with a low-reflectivity coating (e.g., an ultra-antireflective (UAR) coating). The seed beams from the oscillators may diverge as the seed beams enter the amplifier and rapidly begin to overlap. For example, as the seed beams enter the amplifier, each respective seed beam may diverge and overlap with one or more adjacent beams. In this way, the seed beams may collectively fill the amplifier region fully and uniformly (e.g., the aggregated area occupied by the seed beams covers the full area of the amplifier). Furthermore, because the various seed beams may diverge rapidly and overlap with each other upon entering the amplifier, the amplifier region may have a more uniform optical profile across a lateral direction and/or may provide a more uniform near field. In some implementations, the gratings may have different pitches such that, for example, the output wavelengths are chirped laterally, which enables the use of wavelength beam combining (WBC) to enhance the brightness of the monolithic diode chip. Furthermore, using WBC enables power scaling of the monolithic diode chip without sacrificing brightness, which can lead to significant cost-saving benefits.

Figure 2A:
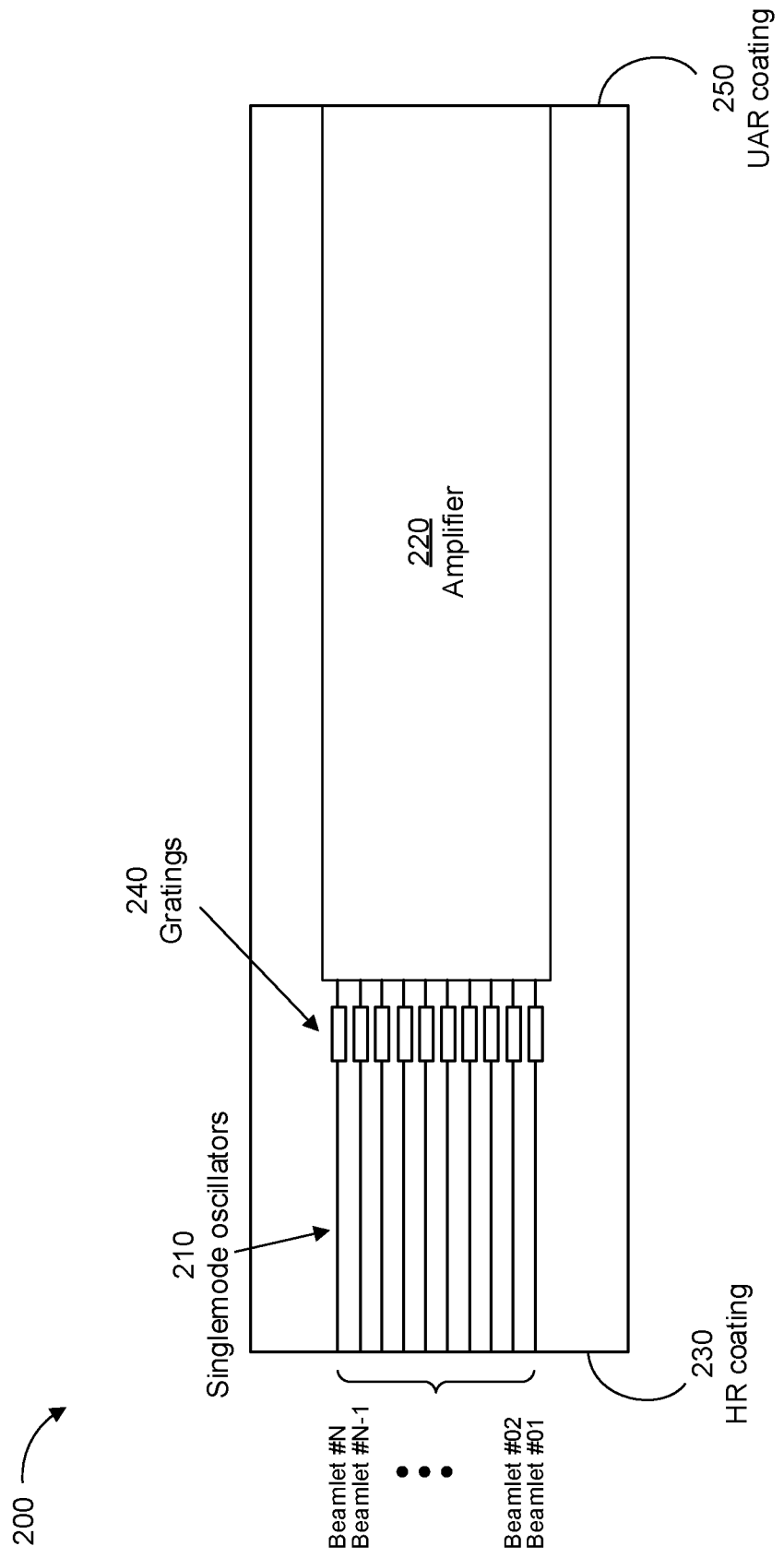
FIGS. 2A-2C are diagrams relating to one or more example implementations of a monolithic MOPA diode chip that includes multiple grating-locked, singlemode oscillators coupled into a shared amplifier region.
Figure 2B:
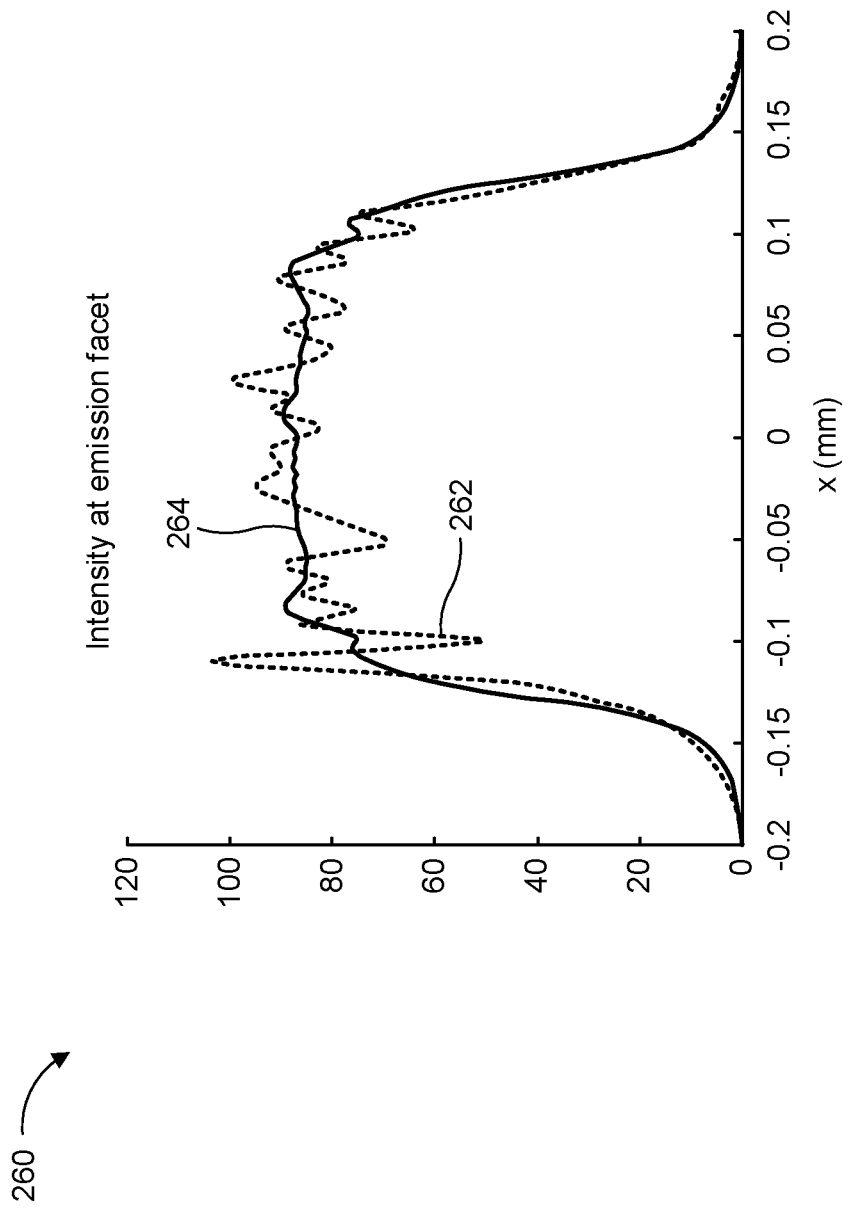
Figure 2C:
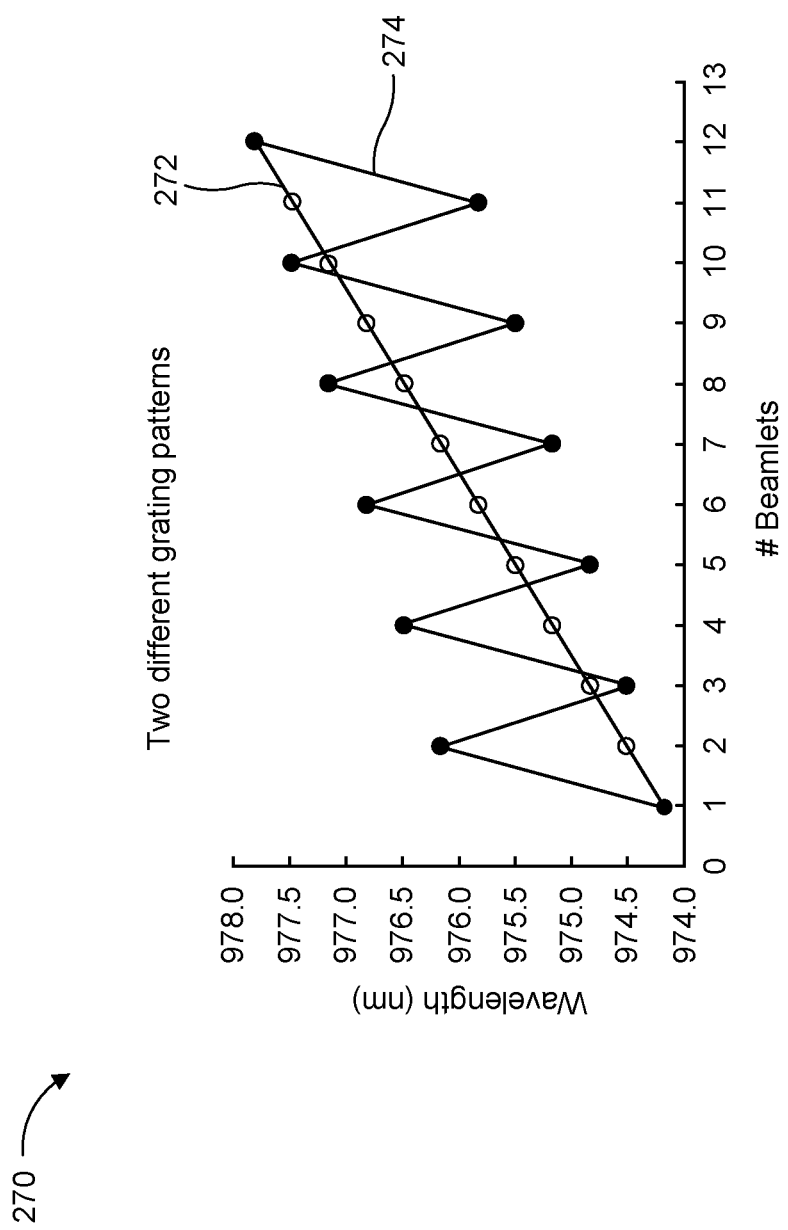

FIGS. 2A-2C are diagrams relating to one or more example implementations of a monolithic MOPA diode chip 200 that includes multiple grating-locked, singlemode oscillators 210 coupled into a shared amplifier structure 220. As shown in FIG. 2A, the singlemode oscillators 210 may include a first (e.g., rear) facet that has an HR coating 230 and/or a rear grating (not shown) at or near the first facet, the shared amplifier structure 220 terminating at a second (e.g., emission or output) facet that has a UAR coating 250 (or another suitable low-reflectivity coating), an oscillator array that includes the multiple singlemode oscillators 210 coupled to the first facet, and one or more front gratings 240 located at an interface between the multiple singlemode oscillators 210 and the shared amplifier structure 220 (e.g., to provide feedback to the singlemode oscillators 210). For example, in FIG. 2A, multiple gratings 240 are provided at the interface between each respective singlemode oscillator 210 and the shared amplifier structure 220, which has a non-flared geometry in FIG. 2A. Alternatively, in some implementations, a single grating 240 may extend over all or most of the oscillators 210 in the oscillator array, as in a distributed-feedback laser.

In some implementations, as described herein, the singlemode oscillators 210 in the oscillator array may be configured to generate multiple seed beams, and the multiple singlemode oscillators 210 may transmit the multiple seed beams through the gratings 240 and into the amplifier structure 220. For example, the oscillator array may generally include N singlemode oscillators 210, where N is an integer having a value greater than or equal to two (2). Accordingly, the N singlemode oscillators 210 may generate N seed beams, which are shown in FIG. 2A as beamlets numbered 1 through N. In some implementations, the N singlemode oscillators 210 may all seed the shared broad-area amplifier structure 220, whereby the seed beams transmitted by the singlemode oscillators 210 may diverge as the seed beams enter the amplifier structure. For example, because the amplifier structure 220 has a broader width than the individual singlemode oscillators 210, the seed beams may diverge (e.g., spread) upon entering the amplifier structure 220 and may rapidly begin to overlap. For example, as the seed beams enter the amplifier, each respective seed beam may diverge and overlap with one or more adjacent beams. In this way, because the various seed beams may diverge rapidly and overlap with each other upon entering the amplifier structure 220, the seed beams may collectively fill the amplifier region fully and uniformly, and the amplifier region may have a more uniform optical profile across a lateral direction and/or may provide a more uniform near field. For example, the seed beams transmitted by the various singlemode oscillators 210 may have a uniform beamwidth such that each seed beam occupies the same area within the amplifier structure 220, and an aggregate area occupied by all the seed beams may cover the full area of the amplifier structure 220. Furthermore, in FIG. 2, the amplifier structure 220 has a non-flared geometry (e.g., the same width at an input end and an output end), whereby a portion of the seed beams expanding toward the edges of the amplifier structure 220 is either truncated (e.g., as in a gain-guided multimode diode) or reflected back into the center of the waveguide (e.g., as in an index-guided multimode diode).

In some implementations, the design of the monolithic MOPA diode chip 200 shown in FIG. 2A provides various advantages over existing technologies. For example, the overlapping seed beams may extract gain from the amplifier structure 220 more efficiently than conventional flared MOPAs with a single seed, due to the greater total seed power from the multiple singlemode oscillators 210, as well as the greater uniformity due to the overlapping expanding beams from the singlemode oscillators 210. Furthermore, because the seed beams are incoherent with one another (which can be enforced by writing the gratings with different wavelengths within the target band, such as distributed between 973 nm and 979 nm), each seed beam independently propagates through the amplifier structure 220 as a smooth singlemode beam, and the total power throughout the amplifier structure 220 (and particularly on the exit facet) can be kept highly uniform and free of filamentation. For example, FIG. 2B illustrates a plot 260 showing the reduction or elimination of filamentation by the monolithic MOPA diode chip 200. For example, in FIG. 2B, curve 262 illustrates a facet transverse intensity profile for a typical filamented beam from a conventional multimode emitter, where the beam includes multiple sharp spatial peaks that are distributed across the emission facet. In contrast, curve 264 illustrates a facet transverse intensity profile for the monolithic MOPA diode chip 200, which includes a stable intensity that is substantially free of spatial peaks across the emission facet.

In some implementations, as described above, the multiple singlemode oscillators 210 may transmit respective seed beams (or "beamlets") into the amplifier structure 220 through the gratings 240. Furthermore, to ensure that the seed beams are incoherent with one another such that the seed beams independently propagate through the amplifier structure 220 and total power on the emission facet is highly uniform and free from filamentation, the seed beams may be associated with a grating pitch pattern within a target band, and the gratings 240 may be written with different corresponding wavelengths within the target band. For example, in some implementations, the target band may include wavelengths that are distributed between 973 nm and 979 nm, whereby a seed beam having a lowest numerical index (e.g., 1, 2, . . . N) may have a lowest wavelength and a seed beam having a highest index may have a highest wavelength, or vice versa. Furthermore, wavelengths of seed beams having intermediate indexes may be determined within the target band according to the grating pitch pattern. For example, in some implementations, a first grating pitch pattern may be associated with laterally uniform pitch changes, or a second grating pitch pattern may be associated with the largest possible pitch changes while all the pitches preserve a beamlet pumping wavelength in a target range (e.g., 976 nm±3 nm). In general, the first grating pitch pattern (with laterally uniform pitch changes) may be useful for a laterally uniform color chirping, and the second grating pitch pattern (with the largest possible pitch change between adjacent seed beams) may be useful for more independent seed pumping, and thus a greater reduction in filamentation.

For example, FIG. 2C illustrates an example plot 270 showing a pumping wavelength for different seed beams (or beamlets). In particular, plot 270 illustrates a first curve 272 for the first grating pitch pattern, with laterally uniform pitch changes that are useful for a laterally uniform color chirping. In addition, plot 270 illustrates a second curve 274 for the second grating pitch pattern, with the largest possible pitch changes while all the pitches preserve a beamlet pumping wavelength in a range of 976 nm±3 nm, which is useful for incoherent pumping. As a result of the decreased filamentation, the monolithic MOPA diode chip 200 may operate at a higher total power than a conventional emitter without reaching a catastrophic optical damage intensity threshold.

As indicated above, FIGS. 2A-2C are provided as examples. Other examples may differ from what is described with regard to FIGS. 2A-2C. For example, the number and arrangement of components shown in FIGS. 2A-2C are provided as examples. In practice, there may be additional components, fewer components, different components, or differently arranged components than shown in FIGS. 2A-2C. Furthermore, two or more components shown in FIGS. 2A-2C may be implemented within a single component, or a single component shown in FIGS. 2A-2C may be implemented as multiple, distributed components. Additionally, or alternatively, a set of components shown in FIGS. 2A-2C may perform one or more functions described as being performed by another set of components shown in FIGS. 2A-2C.

Figure 3A:
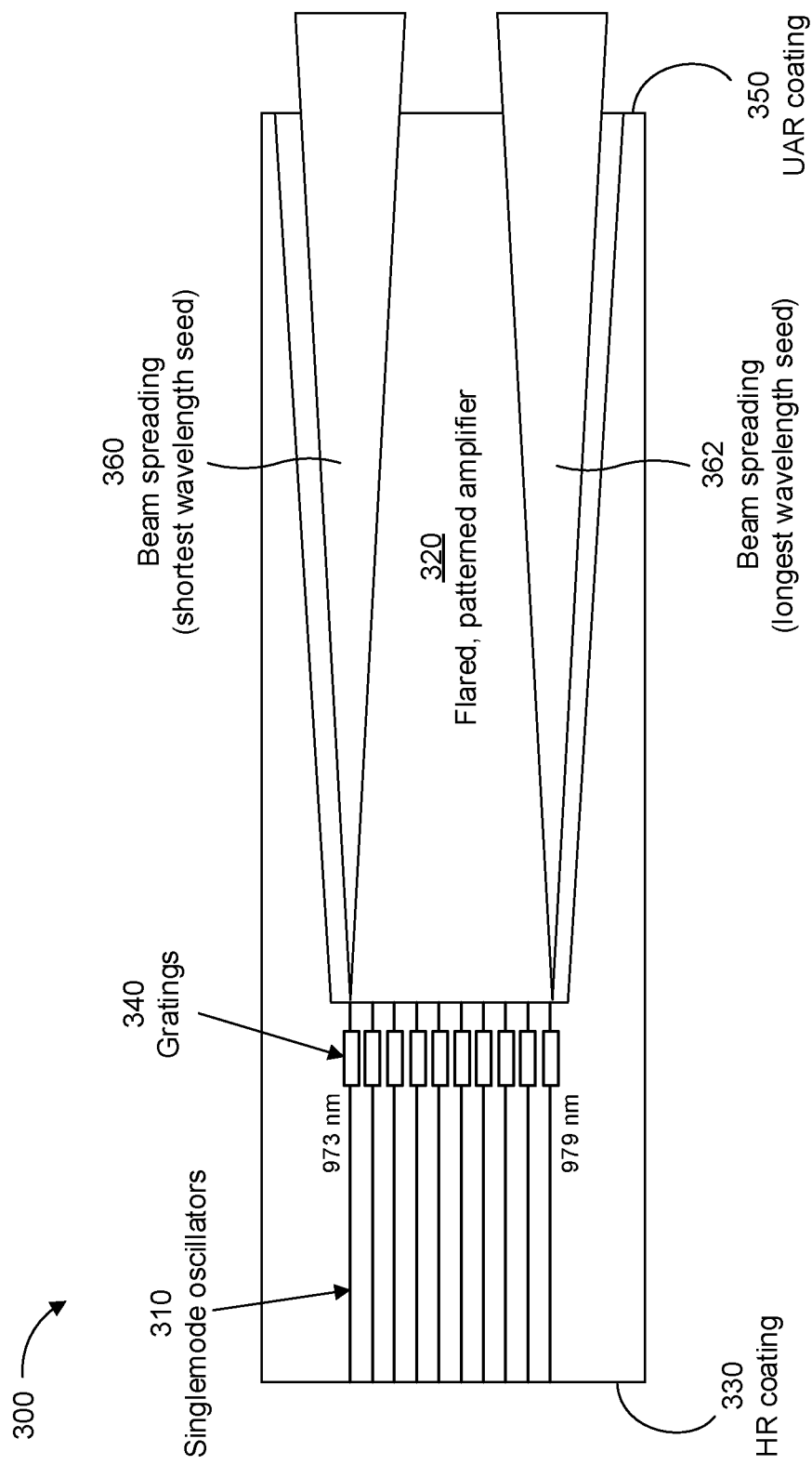
FIGS. 3A-3C are diagrams relating to one or more example implementations of a monolithic MOPA diode chip that includes multiple grating-locked, singlemode oscillators coupled into a shared amplifier region having a flared geometry.
Figure 3B:
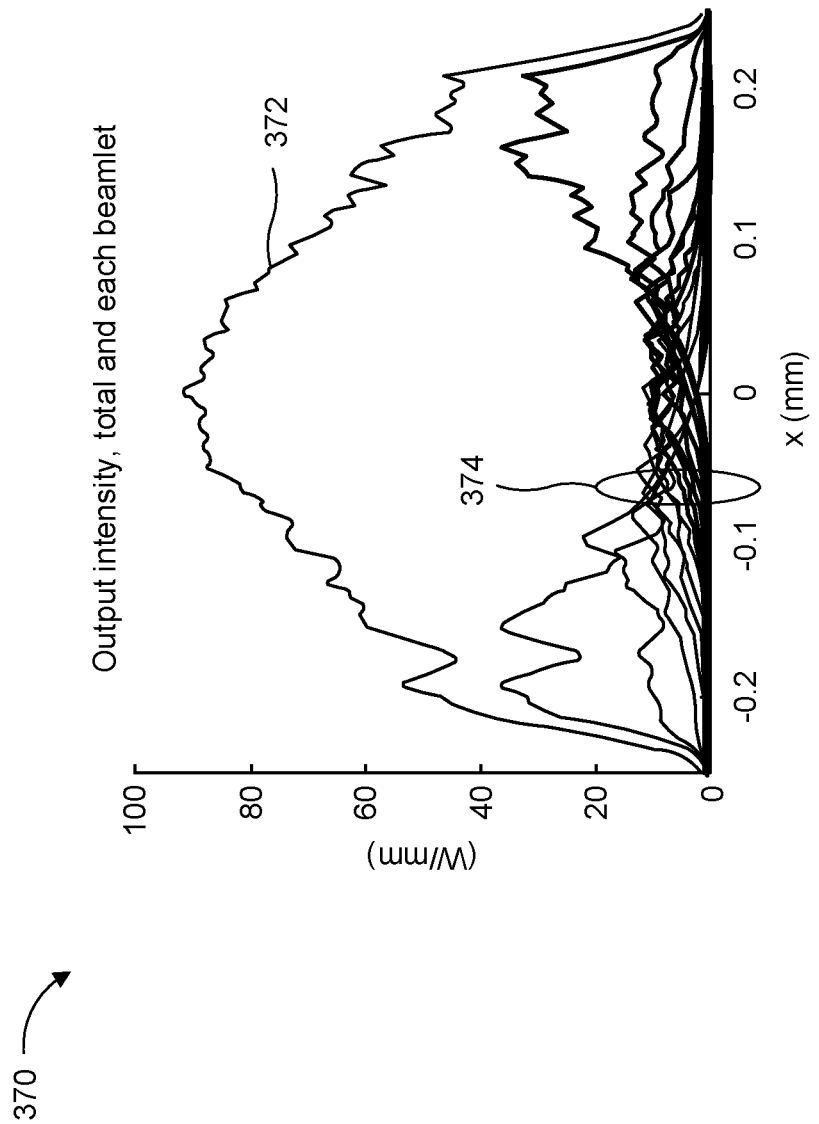
Figure 3C:
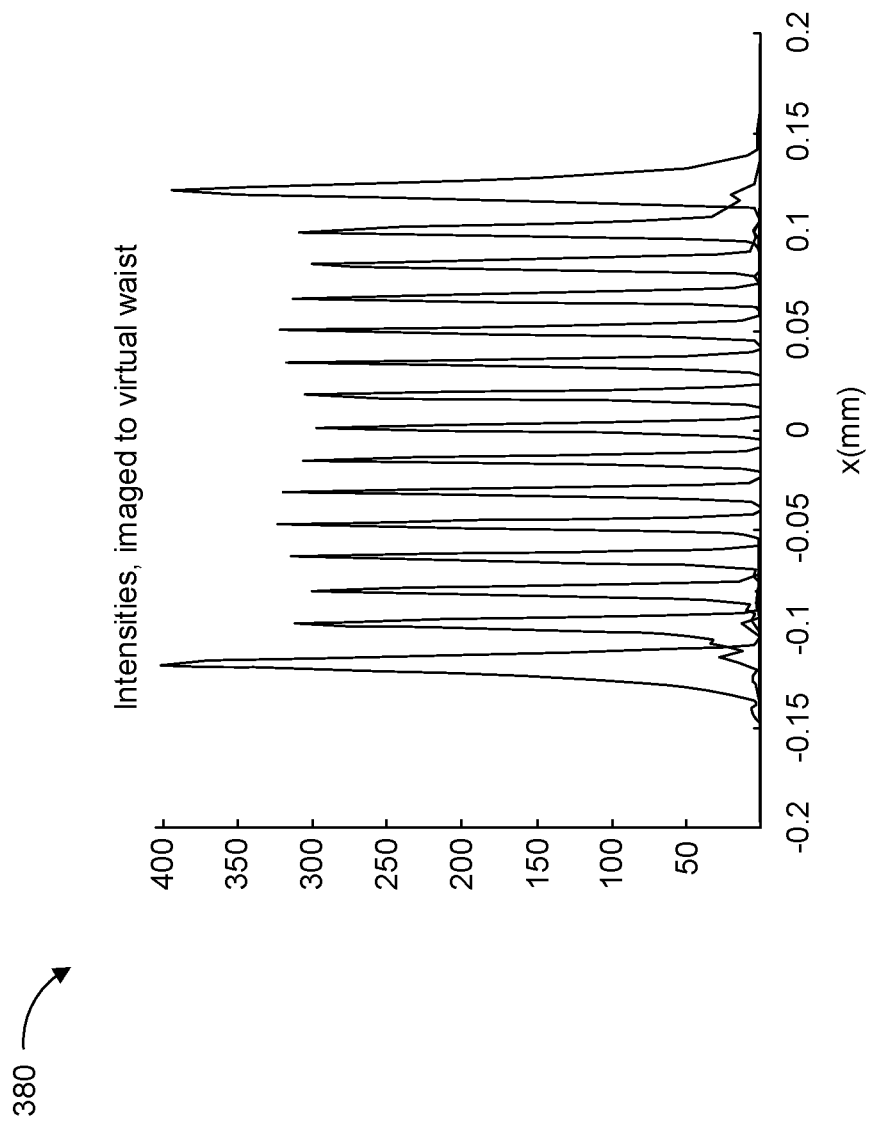

FIGS. 3A-3C are diagrams relating to one or more example implementations of a monolithic MOPA diode chip 300 that includes multiple grating-locked, singlemode oscillators 310 coupled into a shared amplifier structure 320 having a flared geometry. For example, as shown in FIG. 3A, the MOPA diode chip 300 may have a similar structure as the MOPA diode chip 200 shown in FIG. 2A, including a first (e.g., rear) facet that has an HR coating 330 and/or a grating (not shown) at or near the first facet, a shared amplifier structure 320 terminating at a second (e.g., emission or output) facet that has a UAR coating 350 (or another suitable low-reflectivity coating), an oscillator array that includes multiple singlemode oscillators 310 coupled to the first facet, and a grating array that includes one or more gratings 340 coupling the multiple singlemode oscillators 310 into the shared amplifier structure 320. However, whereas the amplifier structure 220 in the MOPA diode chip 200 has a non-flared geometry that causes seed beams expanding at the edges to be truncated or reflected, the MOPA diode chip 300 shown in FIG. 3A has a flared geometry that allows the seed beams to expand without being truncated or reflected by the edges of the flared amplifier structure 320.

For example, as shown in FIG. 3A, the amplifier structure 320 may be flared such that each seed beam can expand freely through the amplifier structure 320 without lateral reflection and/or with reduced truncation. The grating 340 coupled to each respective oscillator 310 may be written with a different wavelength, and the wavelengths may vary monotonically and uniformly from a shortest wavelength on one side of the array to a longest wavelength on the other side (e.g., the array is "spatially chirped" according to a grating pitch pattern, examples of which are shown in FIG. 2C). The wavelength range depicted in FIG. 3A (e.g., from 973 nm to 979 nm) roughly matches the width of the 976 nm absorption band in Yb, and therefore represents approximately the greatest wavelength spread that would be preferable for pumping Yb. The spreading beams of the shortest and longest wavelength seeds are depicted by reference numbers 360 and 362 respectively, and the intermediate beams may be distributed between the spreading beams of the shortest and longest wavelength seeds.

In this way, due to the free expansion in the flared amplifier structure 320, the MOPA diode chip 300 shown in FIG. 3A has a design that may enable each seed beam to maintain a virtual singlemode source at the tip of the corresponding singlemode oscillator 310, whereby a diffraction grating (or similar dispersive component) that is optically matched to the spatial chirp of the oscillator array may be used downstream of the MOPA diode chip 300 (e.g., downstream of the emission facet) to optically reposition the beams on top of one another in a form of wavelength beam combining (WBC). In an ideal limit, such a WBC device could have a true spatially singlemode output that covers many wavelengths, with a total power that is equal to or greater than a conventional multimode emitter. As a singlemode emitter, the MOPA diode chip 300 may have an effective emitting area on the order of a few microns, as compared to >100 microns for a typical multimode emitter. Accordingly, the brightness of the MOPA diode chip 300 may be many times higher than a conventional multimode emitter. Additionally, the MOPA diode chip 300 can be power-scaled by adding oscillators 310 to the oscillator array and increasing the emitting width, without degrading the brightness as in conventional multimode emitters.

FIG. 3B and FIG. 3C illustrate plots 370, 380 based on simulations of a device with fifteen (15) oscillators in an array that is 220 microns wide, with the amplifier structure tapered up (or flared) to 440 microns. For example, as shown in FIG. 3B, plot 370 includes a first curve 372 to represent a total output intensity for the fifteen seed beams generated by the fifteen oscillators, and a set of curves 374 to represent the output intensity for each individual seed beam. Furthermore, as shown in FIG. 3C, plot 380 represents the intensities of each individual seed beam, which are imaged to a virtual waist (e.g., a location where a width of the seed beam is narrowest, typically at the launch point where the seed beam enters the flared amplifier structure 320). The intensities shown in FIGS. 3B-3C include thermal and gain-saturation effects, and the seed beams are well-overlapped at the output from the flared amplifier structure 320 and fairly well-separated at the image of the virtual waist.

In some cases, there may be some beam distortion, steering, and/or displacement of the beams during transmission through the amplifier structure 320, due to effects such as thermal lensing, carrier-density variations, and gain saturation, among other examples. Additionally, or alternatively, the grating wavelengths may not be perfectly controlled. Accordingly, in some implementations, a WBC may be designed to improve the brightness of the MOPA diode chip 300 significantly over conventional multimode emitters (e.g., by doubling the brightness or equivalently reducing the effective emitting width by a factor of two or more, relative to the actual emitter width). Additionally, there are various improvements that can be made to the MOPA diode chip 300 to mitigate beam degradation and generally optimize performance.

For example, in some implementations, an electrical contact area of the amplifier structure 320 may be patterned to achieve a desired spatial variation of carrier injection and thus optical gain. In particular, if the optical gain is transversely uniform across the amplifier structure 320, the total intensity distribution at the output facet may be highly peaked at the middle due to the overlap of many seed beams at that location. Accordingly, in some implementations, a transverse gain profile may be used, where a gain along a center of the amplifier structure 320 is reduced relative to a gain near a periphery of the amplifier structure 320, whereby the profile of the total power remains roughly flat-topped throughout the amplifier structure 320 and across the output facet.

Additionally, or alternatively, in some implementations, the regions near the gratings 340 may be designed not to be pumped, such that the grating regions remain at constant temperature while the rest of the MOPA diode chip 300 is being pumped. In this way, the wavelengths may be stabilized, and the beam quality through any WBC optics may remain stable, even as the operating current is varied between low and full operating current. In some implementations, the grating wavelengths may be fine-tuned such that the array chirp is not fully uniform, in order to precompensate or otherwise counteract any transverse beam offset caused by the amplifier structure 320 (e.g., via thermal lensing). In some implementations, launch points of the oscillators 310 into the amplifier structure 320 may be positioned or otherwise fine-tuned transversely to account for transverse beam offset in the amplifier structure 320 and/or may be tuned longitudinally to account for lensing (e.g., variation of lens strength) in the amplifier structure 320. In some implementations, launch directions of the oscillators 310 into the amplifier structure 320 may be fine-tuned, for example, by bending the oscillators 310 (although at the rear facet the oscillators 310 may remain perpendicular), in order to counteract beam steering in the amplifier structure 320. In general, although these improvements are described with respect to the MOPA diode chip 300 shown in FIG. 3A, the same or similar improvements may be applied to any implementation of the monolithic MOPA diode chip described herein and are particularly relevant for WBC implementations.

As indicated above, FIGS. 3A-3C are provided as examples. Other examples may differ from what is described with regard to FIGS. 3A-3C. For example, the number and arrangement of components shown in FIGS. 3A-3C are provided as examples. In practice, there may be additional components, fewer components, different components, or differently arranged components than shown in FIGS. 3A-3C. Furthermore, two or more components shown in FIGS. 3A-3C may be implemented within a single component, or a single component shown in FIGS. 3A-3C may be implemented as multiple, distributed components. Additionally, or alternatively, a set of components shown in FIGS. 3A-3C may perform one or more functions described as being performed by another set of components shown in FIGS. 3A-3C.

Figure 4:
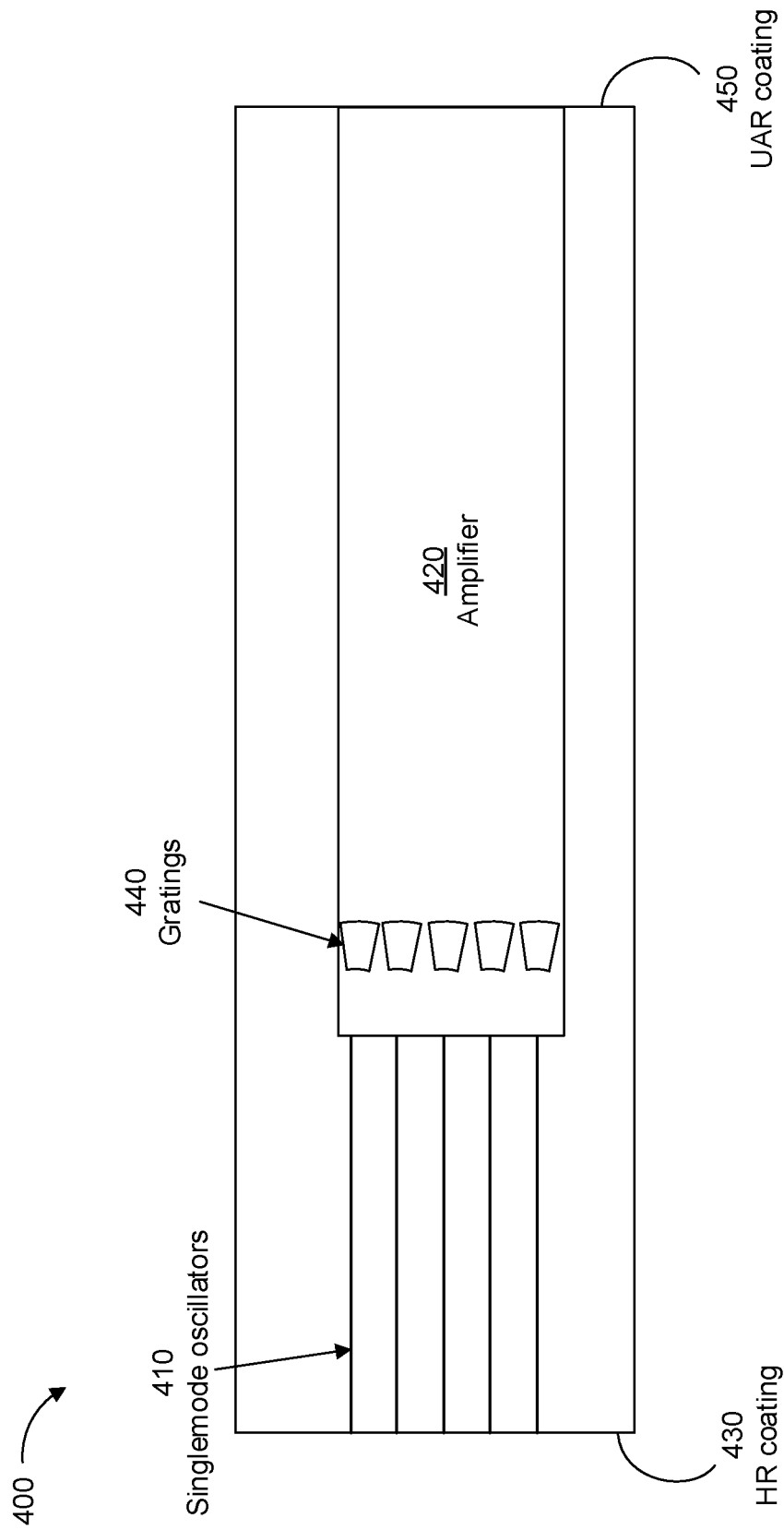
FIGS. 4-6 are diagrams illustrating one or more example implementations of a monolithic MOPA diode chip that includes multiple grating-locked, singlemode oscillators coupled into an amplifier region.
Figure 5:
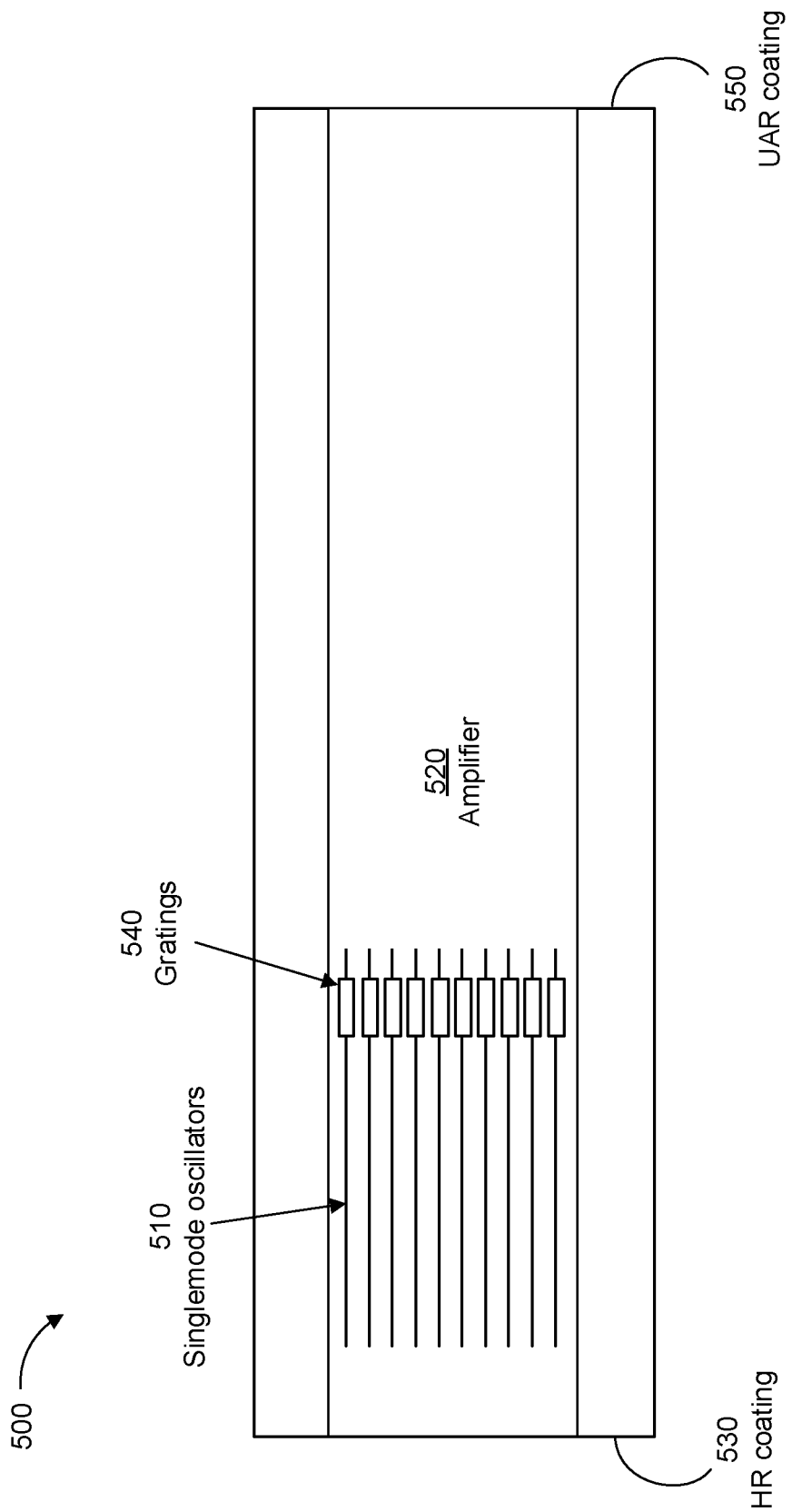
Figure 6:
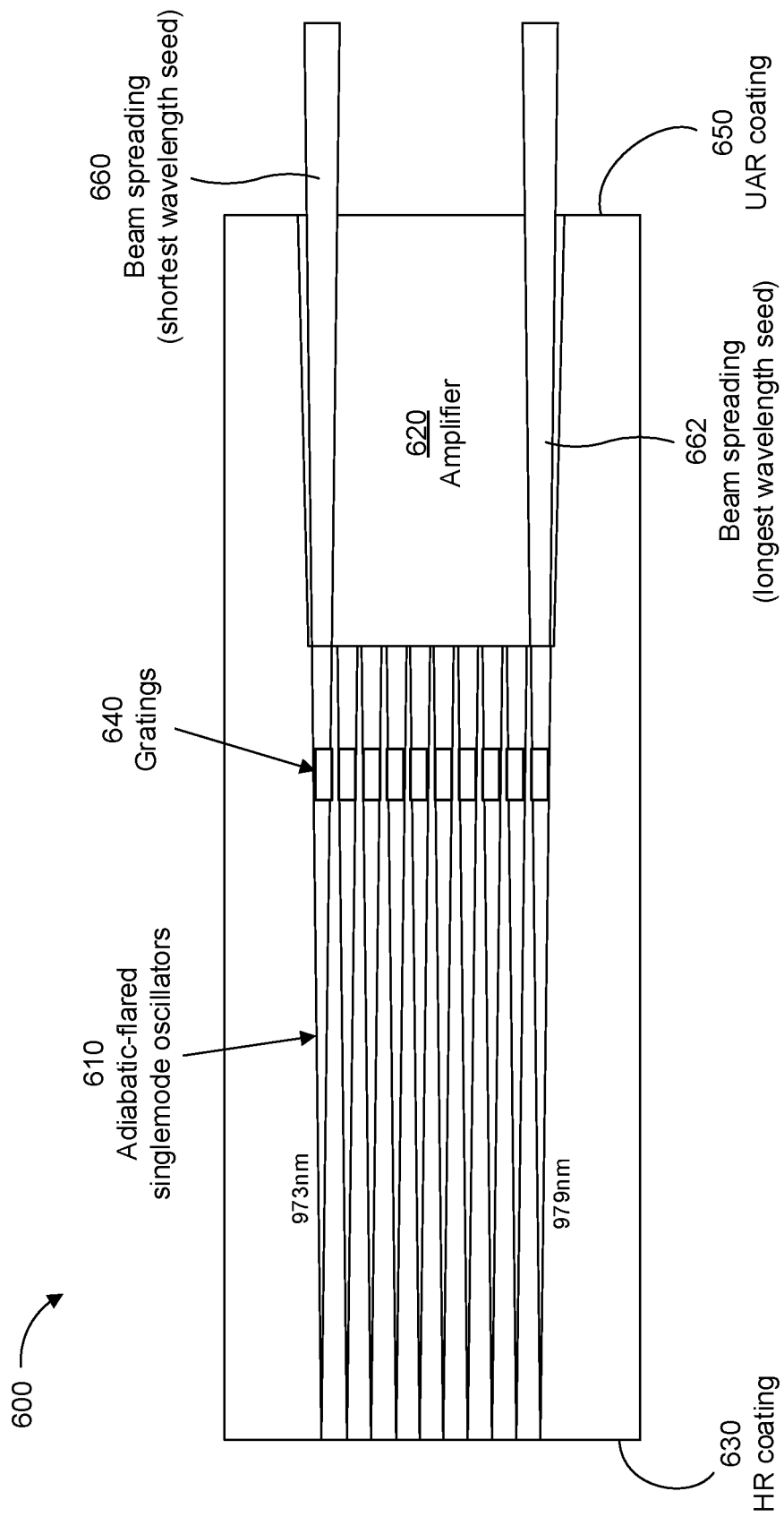

FIGS. 4-6 are diagrams illustrating one or more example implementations of monolithic MOPA diode chips 400, 500, 600 that each include multiple grating-locked, singlemode oscillators coupled into an amplifier region.

For example, as shown in FIG. 4, the MOPA diode chip 400 may have a similar structure as the MOPA diode chips 200, 300 described in further detail above, including a first (e.g., rear) facet that has an HR coating 430 and/or a grating (not shown) at or near the first facet, a shared amplifier structure 420 terminating at a second (e.g., emission or output) facet that has a UAR coating 450 (or another suitable low-reflectivity coating), an oscillator array that includes multiple singlemode oscillators 410 coupled to the first facet, and a grating array that includes one or more gratings 440 coupling the multiple singlemode oscillators 410 into the shared amplifier structure 420. However, as shown in FIG. 4, the gratings 440 may be located within the amplifier structure 420 and may have a curved geometry to focus the diverging seed beams back into respective waveguides. In this way, the singlemode oscillators 410 may have longer effective lengths, which may increase the respective seed power from each singlemode oscillator 310 and make the structure more stable optically.

In another example, as shown in FIG. 5, the MOPA diode chip 500 may have a similar structure as the MOPA diode chips 200, 300, 400 described in further detail above, including a first (e.g., rear) facet that has an HR coating 530 and/or a grating (not shown) at or near the first facet, a shared amplifier structure 520 terminating at a second (e.g., emission or output) facet that has a UAR coating 550 (or another suitable low-reflectivity coating), an oscillator array that includes multiple singlemode oscillators 510 coupled to the first facet, and a grating array with one or more gratings 540 coupling the multiple singlemode oscillators 510 into the shared amplifier structure 520. Furthermore, in FIG. 5, the MOPA diode chip 500 may have a structure that is folded in the middle, such that the oscillators 510 and the gratings 540 are embedded within the amplifier structure 520. In this way, the MOPA diode chip 500 shown in FIG. 5 may have a structure that enables a more efficient use of chip area. In the design shown in FIG. 5, the singlemode oscillators 510 are terminated by the HR coating 530 at the rear facet at one end, and by high-reflective gratings 540 at the other. Because the waveguides do not extend all the way to the HR coating 530, the oscillators 510 include a free-expansion section, and not all of the oscillator beam is recaptured by the waveguide when the beam returns from the HR coating 530. As a result, the oscillators 510 are unstable resonators and an output coupling from the oscillators 510 may be defined by how much of the signal escapes the waveguide (and proceeds to seed the amplifier structure 520).

As described herein, one or more design parameters for the monolithic MOPA diode chip can vary across different implementations. For example, the monolithic MOPA diode chip may use very short oscillators (e.g., 0.5 mm in length) and a long amplifier structure (e.g., 5 mm in length) to achieve maximum power. In another example, the device may include long oscillators that extend most of the length of the chip (e.g., 5 mm in length) with a very short shared amplifier structure (e.g., 0.5 mm in length), in which each seed beam overlaps only with a nearest neighbor or neighbors to form a relatively uniform power distribution at the output facet.

Accordingly, FIG. 6 illustrates an example design for a monolithic MOPA diode chip 600 that uses the degree of freedom provided when each seed beam overlaps only with a nearest neighbor or neighbors to form a relatively uniform power distribution at the output facet. As shown in FIG. 6, the MOPA diode chip may include a first (e.g., rear) facet that has an HR coating 630 and/or a grating (not shown) at or near the first facet, a shared amplifier structure 620 terminating at a second (e.g., emission or output) facet that has a UAR coating 650 (or another suitable low-reflectivity coating), an oscillator array that includes multiple singlemode oscillators 610 coupled to the first facet, and a grating array that includes one or more gratings 640 coupling the multiple singlemode oscillators 610 into the shared amplifier structure 620. Furthermore, the oscillators 210 may extend much of the length of the MOPA diode chip 600, and the oscillators 210 may each individually flare adiabatically from a first singlemode width at the rear facet (e.g., 4 microns at a wavelength of 976 nm) to a width on the order of 10-20 μm at the start of the amplifier structure 620, which would again be short and only allow minimal overlap of neighboring seeds to the extent needed to smooth the power profile at the output facet. In this way, an adiabatically-expanded oscillator array may reduce output divergence and thermal lensing in the amplifier structure 620, which significantly improves brightness, potentially in conjunction with brightness gains achieved by WBC. Furthermore, in some implementations, the on-chip gratings 640 may be first order or second order, and may be fabricated by any suitable technique, including e-beam lithography, nanoimprint lithography, and/or holographic lithography, among other examples.

As indicated above, FIGS. 4-6 are provided as examples. Other examples may differ from what is described with regard to FIGS. 4-6. For example, the number and arrangement of components shown in FIGS. 4-6 are provided as examples. In practice, there may be additional components, fewer components, different components, or differently arranged components than shown in FIGS. 4-6. Furthermore, two or more components shown in FIGS. 4-6 may be implemented within a single component, or a single component shown in FIGS. 4-6 may be implemented as multiple, distributed components. Additionally, or alternatively, a set of components shown in FIGS. 4-6 may perform one or more functions described as being performed by another set of components shown in FIGS. 4-6.

Figure 7:
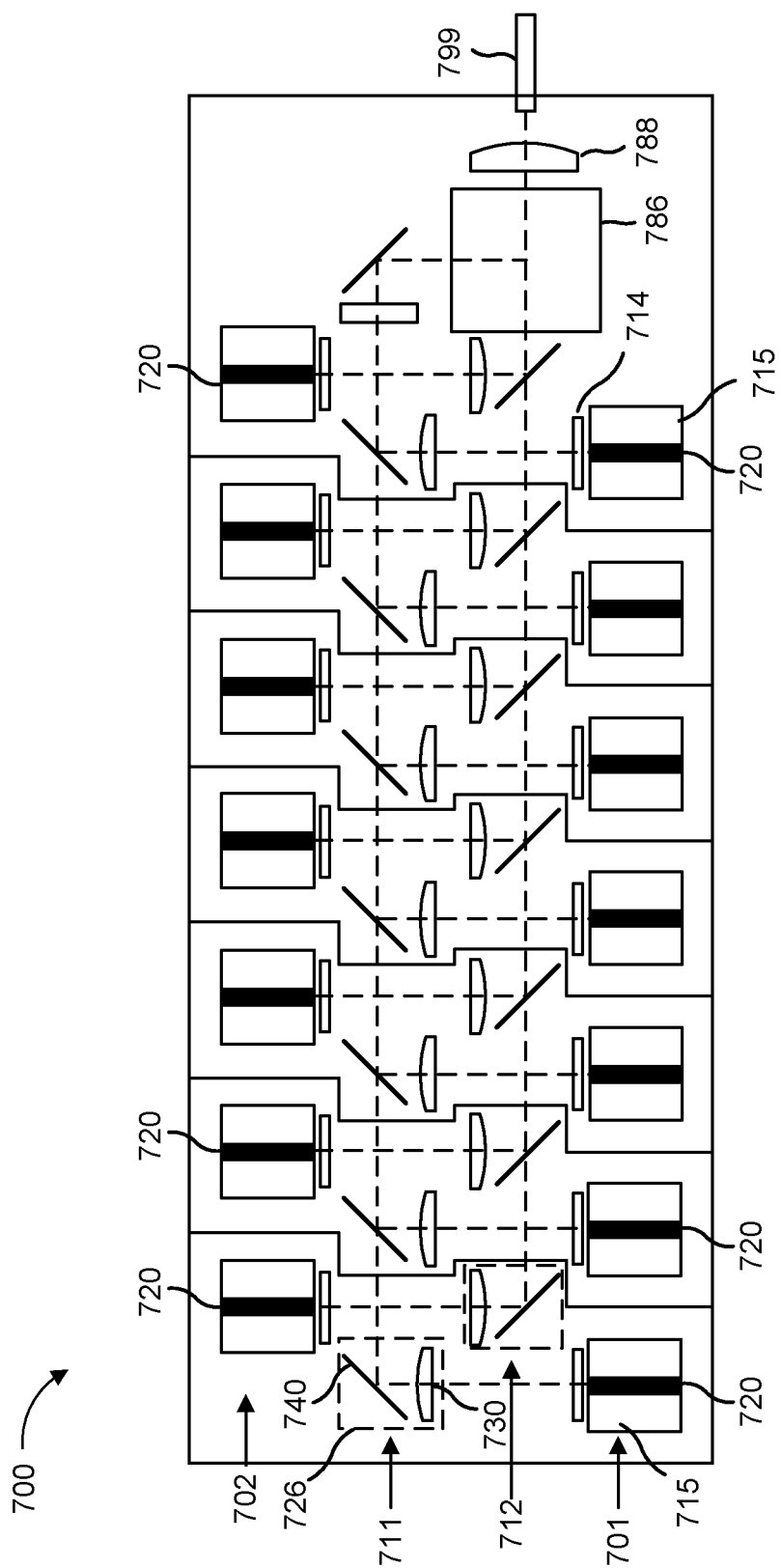
FIG. 7 is a diagram illustrating an example of a multi-chip package structure.

FIG. 7 is a diagram illustrating an example of a multi-chip package structure 700, which may be suitable to use with one or more implementations of a monolithic MOPA diode chip as described herein. As shown in FIG. 7, the multi-chip package structure 700 may include fourteen (14) emitters 720 that are arranged in two opposing, offset banks 701, 702, which may be mounted upon a stepped surface with mounting pads 715 that provide electrical contact to the emitters 720 and thermal contact between the emitters 720 and a support base. Each set of seven emitters 720 is staggered in height from highest to lowest, from left to right. The seven beams from each chip bank 701, 702 pass through respective fast axis collimators 714 that collimate the beams in planes of their respective fast axes, and the seven beams cross the opposing beams and reflect off 45° turning mirrors 740 that stack the seven beams atop one another (not shown). For example, the multi-chip package structure 700 includes two rows 711 and 712 of beam collimating reflectors (BCR) 726 that are coupled to and optically aligned with a respective emitter 720, where each BCR 726 includes a slow axis collimator (SAC) 730 followed by a turning mirror 740. The two sets of stacked beams are combined at a PBC 786 and subsequently focused into an output fiber 799 using a coupling optic 788, such as a coupling lens. In some implementations, using laterally chirped MOPA chips as the emitters 720, a WBC (e.g., as shown in FIG. 8) may be used to improve the beam quality, for example, enabling wide chips (e.g., 200 microns or wider), to couple efficiently into smaller output fibers such as a 105 µm or 135 µm (or smaller) core fiber.

As indicated above, FIG. 7 is provided as an example. Other examples may differ from what is described with regard to FIG. 7. For example, the number and arrangement of components shown in FIG. 7 are provided as examples. In practice, there may be additional components, fewer components, different components, or differently arranged components than shown in FIG. 7. Furthermore, two or more components shown in FIG. 7 may be implemented within a single component, or a single component shown in FIG. 7 may be implemented as multiple, distributed components. Additionally, or alternatively, a set of components shown in FIG. 7 may perform one or more functions described as being performed by another set of components shown in FIG. 7.

Figure 8:
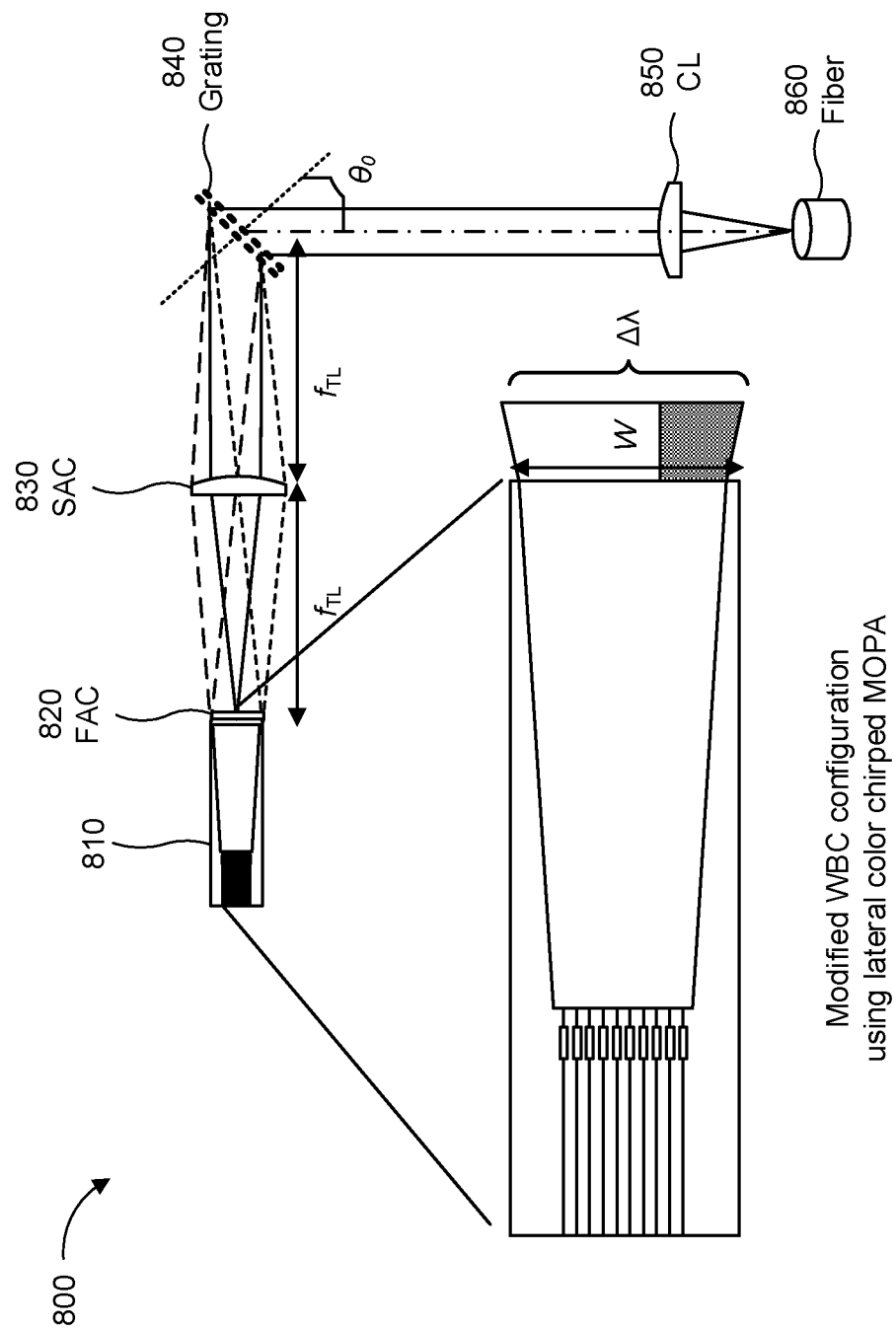
FIG. 8 is a diagram illustrating an example implementation of a wavelength beam combiner (WBC) configuration using a monolithic MOPA diode chip that includes multiple grating-locked, singlemode oscillators coupled into a shared amplifier region.

FIG. 8 is a diagram illustrating an example implementation 800 of a WBC configuration using a monolithic MOPA diode chip 810 that includes multiple grating-locked, singlemode oscillators coupled into a shared amplifier region. For example, as described herein, the MOPA diode chip 810 may have a design that is the same or similar to any one or more of the MOPA diode chips 200, 300, 400, 500, 600 described in further detail above (and/or any suitable combination and/or variation thereof). As shown in in FIG. 8, chirped light from the MOPA diode chip 810 may be coupled through a fast axis collimator (FAC) lens 820 and an SAC lens 830 to a dispersive element 840, shown in FIG. 8 as a transmission grating. In general, the chirped light may include different color components (e.g., shown in FIG. 8 as a gradient covering a wavelength range, $\Delta\lambda$). As shown, each different color component of the chirped light (shown with different dash patterns) may impinge (e.g., strike) the dispersive element 840 with a different incidence angle. With a suitable chip design, dispersion, and SAC focal length, the dispersive element 840 transmits each color at a correct angle such that the output beams are aligned with one another (e.g., at an angle $\theta_0$ relative to the dispersive element 840). The aligned output beams are then focused by a collimating lens 850 into a fiber 860. In contrast to existing "closed-loop" WBC methods, the WBC configuration shown in FIG. 8 may require no feedback to the oscillators from the dispersive element 840, resulting in higher efficiency and reliability. In some implementations, multiple MOPA diode chips 810 can be mounted in a manner similar to that of the multi-chip package structure 700 shown in FIG. 7.

As indicated above, FIG. 8 is provided as an example. Other examples may differ from what is described with regard to FIG. 8. For example, the number and arrangement of components shown in FIG. 8 are provided as examples. In practice, there may be additional components, fewer components, different components, or differently arranged components than shown in FIG. 8. Furthermore, two or more components shown in FIG. 8 may be implemented within a single component, or a single component shown in FIG. 8 may be implemented as multiple, distributed components. Additionally, or alternatively, a set of components shown in FIG. 8 may perform one or more functions described as being performed by another set of components shown in FIG. 8.

Figure 9A:
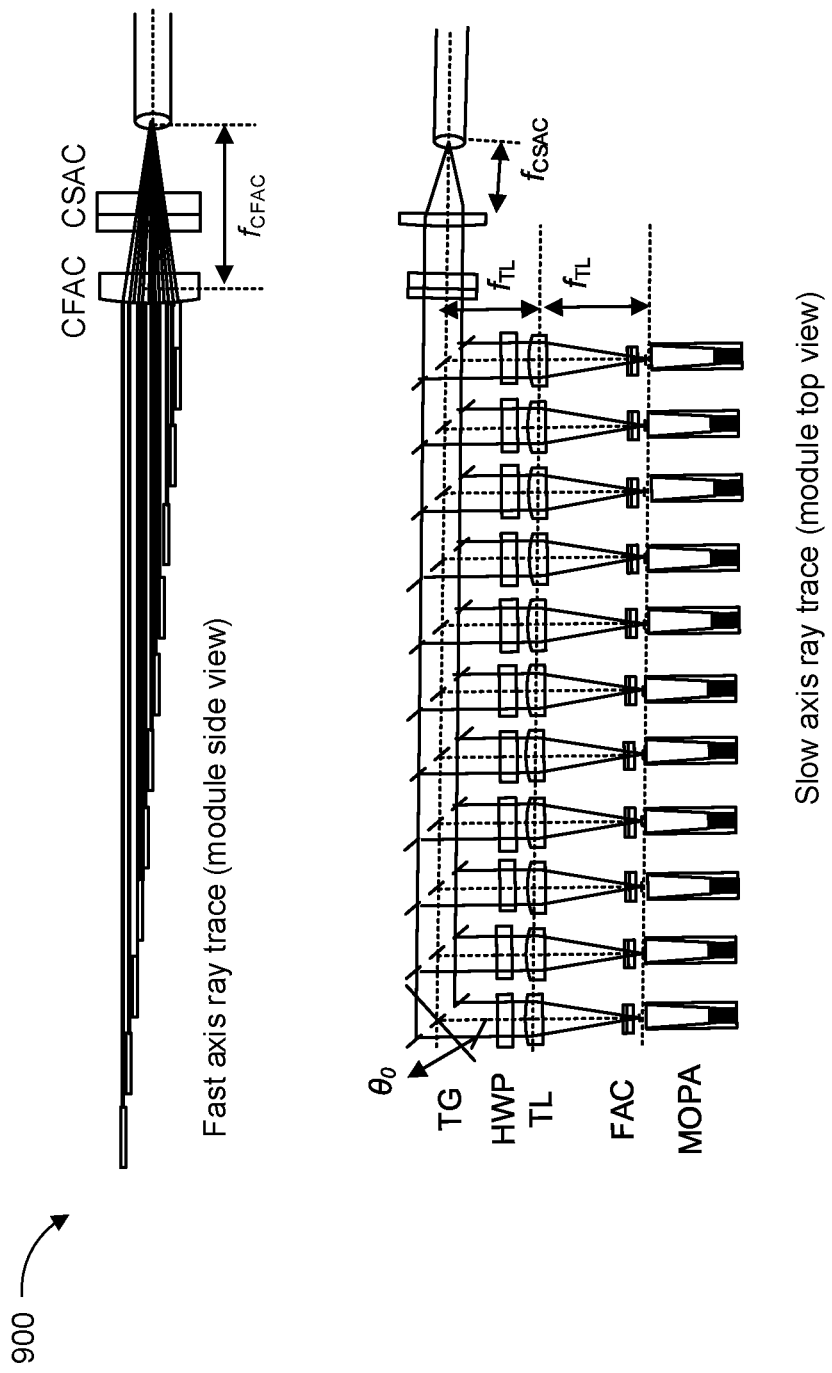
FIGS. 9A-9B are diagrams illustrating one or more example implementations of a multi-chip package structure that includes an WBC configuration with multiple monolithic MOPA diode chips arranged in one or more chip banks.
Figure 9B:
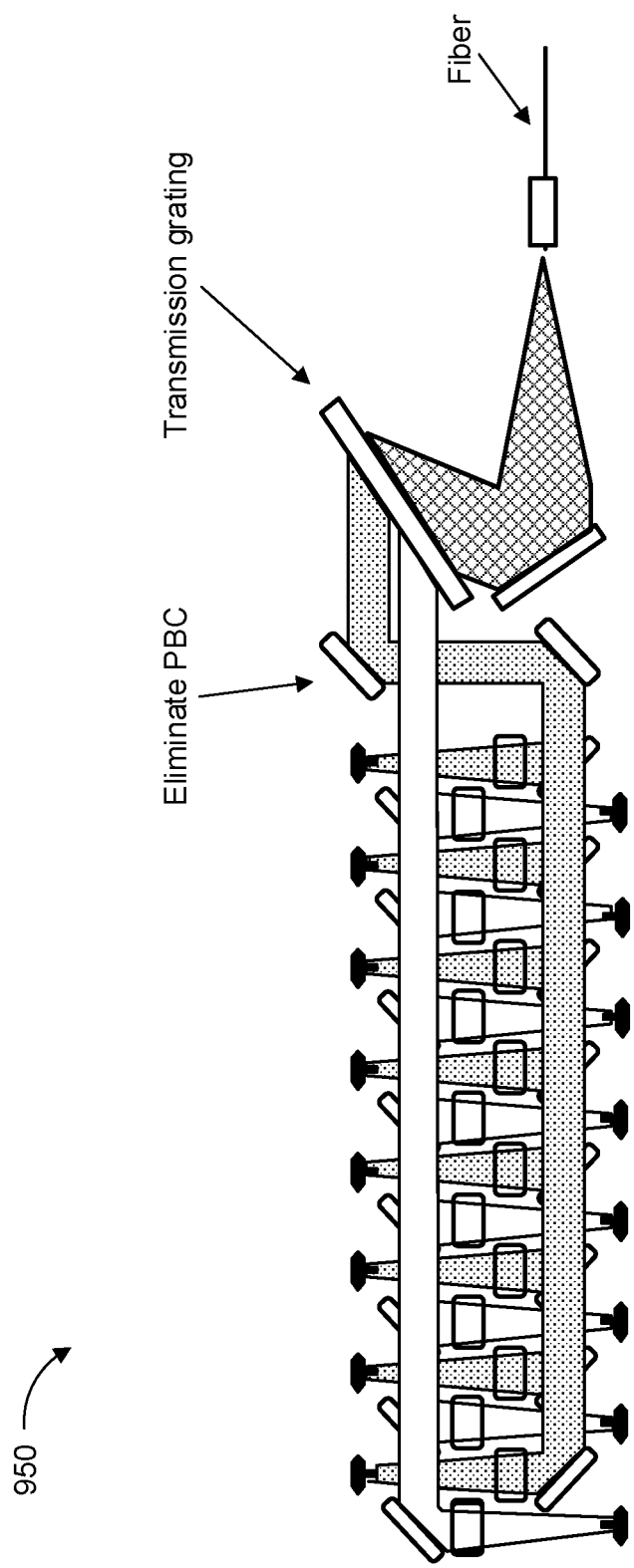

FIGS. 9A-9B are diagrams illustrating one or more example implementations of multi-chip package structures 900, 950 that includes a WBC configuration with multiple monolithic MOPA diode chips arranged in one or more chip banks. For example, FIG. 9A illustrates an example of a multi-chip package structure 900 that has a similar structure as shown in FIG. 7, including a chip bank with multiple MOPA diodes that may be staggered in height. However, whereas the multi-chip package structure 700 in FIG. 7 includes turning mirrors 740, in FIG. 9A each turning mirror 740 is replaced by one transmission grating (TG) (indicated by dashed lines in FIG. 9A). In some implementations, the slow-axis collimation (SAC) lens in FIG. 7 may be used as a transform lens (TL) for WBC. In some implementations, a half-wave plate (HWP) may follow the TL for higher WBC efficiency, or the HWP may be omitted in some implementations. As further shown in FIG. 9A, the multi-chip package structure 900 may include one or more coupling lenses, such as a coupling fast axis collimation (CFAC) lens and a coupling slow axis collimation (CSAC) lens, which may be used for coupling multiple beams into a fiber. Although only one chip bank is shown in FIG. 9A, two opposing, offset chip banks may be used in a similar manner as shown in FIG. 7 and described above. Alternatively, FIG. 9B illustrates an example multi-chip package structure 950 in which one or more turning mirrors are used, and WBC is performed by a single shared transmission grating downstream of the turning mirrors. In some implementations, either one chip bank or two chip banks may be used. As shown in FIG. 9B, two opposing banks are used and, in this case, the PBC may be eliminated and the two banks may be combined spatially at the transmission grating.

As indicated above, FIGS. 9A-9B are provided as examples. Other examples may differ from what is described with regard to FIGS. 9A-9B. For example, the number and arrangement of components shown in FIGS. 9A-9B are provided as examples. In practice, there may be additional components, fewer components, different components, or differently arranged components than shown in FIGS. 9A-9B. Furthermore, two or more components shown in FIGS. 9A-9B may be implemented within a single component, or a single component shown in FIGS. 9A-9B may be implemented as multiple, distributed components. Additionally, or alternatively, a set of components shown in FIGS. 9A-9B may perform one or more functions described as being performed by another set of components shown in FIGS. 9A-9B.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various aspects. In fact, many of these features may be combined in ways not specifically recited in the claims and/or disclosed in the specification. Although each dependent claim listed below may directly depend on only one claim, the disclosure of various aspects includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. An optical assembly, comprising:
    an optical device that includes multiple grating-locked single-mode oscillators configured to transmit multiple seed beams having different wavelengths into a shared amplifier structure,
        wherein the multiple seed beams expand within the shared amplifier structure to form chirped light that is emitted by the optical device;
    a dispersive element in an optical path between a laser diode and an optical fiber; and
    one or more collimator lenses coupling the chirped light to the dispersive element,
        wherein the multiple seed beams that have the different wavelengths impinge upon the dispersive element at different incidence angles, and
        wherein the dispersive element is arranged to transmit the multiple seed beams at respective angles that cause the multiple seed beams to overlap in an output beam that enters the optical fiber.

2. The optical assembly of claim 1, further comprising:
    a collimator lens positioned in the optical path between the dispersive element and the optical fiber, wherein the collimator lens focuses the output beam into the optical fiber.

3. The optical assembly of claim 1, wherein the dispersive element is optically matched to a spatial chirp of the multiple grating-locked single-mode oscillators.

4. The optical assembly of claim 1, wherein the optical device includes a first facet that has a high reflectivity coating, and wherein the chirped light is emitted by the optical device via a second facet that has a low reflectivity coating.

5. The optical assembly of claim 1, wherein the multiple seed beams independently propagate through the shared amplifier structure.

6. The optical assembly of claim 1, wherein the multiple seed beams expand freely through the shared amplifier structure without lateral reflection or with reduced truncation.

7. The optical assembly of claim 1, wherein the dispersive elements are associated with grating elements.

8. A device, comprising:
    an optical component that includes multiple grating-locked single-mode oscillators configured to transmit multiple seed beams having different wavelengths into an amplifier component,
        wherein the multiple seed beams expand within the amplifier component to form chirped light that is emitted by the optical component;
    a dispersive element in an optical path between a laser diode and an optical fiber; and
    one or more collimator lenses coupling the chirped light to the dispersive element, wherein the multiple seed beams that have the different wavelengths impinge upon the dispersive element at different incidence angles, and wherein the dispersive element is arranged to transmit the multiple seed beams at respective angles that cause the multiple seed beams to overlap in an output beam that enters the optical fiber.

9. The device of claim 8, further comprising:
a collimator lens positioned in the optical path between the dispersive element and the optical fiber, wherein the collimator lens focuses the output beam into the optical fiber.

10. The device of claim 8, wherein the dispersive element is optically matched to a spatial chirp of the multiple grating-locked single-mode oscillators.

11. The device of claim 8, wherein the device includes a first facet that has a high reflectivity coating, and wherein the chirped light is emitted by the device via a second facet that has a low reflectivity coating.

12. The device of claim 8, wherein the multiple seed beams independently propagate through the amplifier component.

13. The device of claim 8, wherein the multiple seed beams expand freely through the amplifier component without lateral reflection or with reduced truncation.

14. The device of claim 8, wherein the dispersive elements are associated with grating elements.

15. A device, comprising:
an optical component that includes multiple grating-locked single-mode oscillators configured to transmit multiple seed beams having different wavelengths into an amplifier component, wherein the multiple seed beams expand within the amplifier component to form chirped light that is emitted by the optical component;

a dispersive element in an optical path between the multiple grating-locked single-mode oscillators and an optical fiber; and one or more collimator lenses coupling the chirped light to the dispersive element, wherein the multiple seed beams that have the different wavelengths impinge upon the dispersive element at different incidence angles, and wherein the dispersive element is arranged to transmit the multiple seed beams at respective angles that cause the multiple seed beams to overlap in an output beam that enters the optical fiber.

16. The device of claim 15, further comprising:
a collimator lens positioned in the optical path between the dispersive element and the optical fiber, wherein the collimator lens focuses the output beam into the optical fiber.

17. The device of claim 15, wherein the dispersive element is optically matched to a spatial chirp of the multiple grating-locked single-mode oscillators.

18. The device of claim 15, wherein the device includes a first facet that has a high reflectivity coating, and wherein the chirped light is emitted by the device via a second facet that has a low reflectivity coating.

19. The device of claim 15, wherein the multiple seed beams independently propagate through the amplifier component.

20. The device of claim 15, wherein the multiple seed beams expand freely through the amplifier component without lateral reflection or with reduced truncation.

\* \* \* \* \*